(12) United States Patent
Yoshioka et al.

(10) Patent No.: US 10,763,797 B2
(45) Date of Patent: Sep. 1, 2020

(54) HIGH-FREQUENCY POWER AMPLIFIER

(71) Applicant: Mitsubishi Electric Corporation, Tokyo (JP)

(72) Inventors: Takaaki Yoshioka, Tokyo (JP); Masatake Hangai, Tokyo (JP); Koji Yamanaka, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 33 days.

(21) Appl. No.: 16/094,797

(22) PCT Filed: May 19, 2016

(86) PCT No.: PCT/JP2016/064906
§ 371 (c)(1),
(2) Date: Oct. 18, 2018

(87) PCT Pub. No.: WO2017/199400
PCT Pub. Date: Nov. 23, 2017

(65) Prior Publication Data
US 2019/0131937 A1    May 2, 2019

(51) Int. Cl.
*H03F 1/56* (2006.01)
*H03F 3/60* (2006.01)
*H03F 3/68* (2006.01)
*H03F 3/21* (2006.01)
*H03F 3/193* (2006.01)

(52) U.S. Cl.
CPC ............. *H03F 1/565* (2013.01); *H03F 3/193* (2013.01); *H03F 3/21* (2013.01); *H03F 3/211* (2013.01); *H03F 3/60* (2013.01); *H03F 3/601* (2013.01); *H03F 3/602* (2013.01); *H03F 3/68* (2013.01); *H03F 2200/387* (2013.01); *H03F 2200/423* (2013.01); *H03F 2200/451* (2013.01)

(58) Field of Classification Search
CPC . H03F 1/565; H03F 3/601; H03F 3/21; H03F 3/193; H03F 3/68; H03F 3/60; H03F 2200/451; H03F 2200/423; H03F 3/602
USPC ............................ 330/307, 295, 124 R, 302
See application file for complete search history.

(56) References Cited

U.S. PATENT DOCUMENTS 5,363,060 A    11/1994    Kohno

FOREIGN PATENT DOCUMENTS

| JP | 6-61760 A | 3/1994 |
|---|---|---|
| JP | 9-260975 A | 10/1997 |
| JP | 2014-112789 A | 6/2014 |

*Primary Examiner* — Khanh V Nguyen
*Assistant Examiner* — Khiem D Nguyen
(74) *Attorney, Agent, or Firm* — Birch, Stewart, Kolasch & Birch, LLP

(57) ABSTRACT

A high-frequency power amplifier is configured to include plural island patterns (28) in which ends thereof are arranged in the vicinity of a transmission line (23) and other ends thereof are arranged in the vicinity of an end line (24a) in a transmission line (24), a wire (30) for connecting an end of an island pattern (28) and the transmission line (23), and a wire (31) for connecting another end of the island pattern (28) and the end line (24a) of the second transmission line (24), so that a mismatch of the impedance component having a resistance component and a reactance component can be compensated for by changing the number of first connecting members and the number of second connecting members, the first and second connecting members configured to connect an island pattern (28) to the transmission lines (23) and (24).

9 Claims, 10 Drawing Sheets

HIGH-FREQUENCY POWER AMPLIFIER

TECHNICAL FIELD

The present invention relates to a high-frequency power amplifier that amplifies a high frequency signal.

BACKGROUND ART

For example, in a high-frequency power amplifier that amplifies a high frequency signal such as a microwave or a millimeter wave, in order to maximally bring out the capability of a transistor that amplifies the high frequency signal, i.e., in order to bring out the maximum output characteristics and the maximum efficiency characteristics of the transistor, a transformation of the impedance from the external load to the transistor is performed using a matching circuit.

Concretely, the design of the matching circuit is performed in such a way that a designed value (referred to as a "design impedance" hereafter) of the impedance when the matching circuit is viewed from the connection point between the matching circuit and the transistor matches a load impedance which is determined using a load pull measurement or the like and at which the maximum characteristics of the transistor are acquired.

The matching circuit is usually constituted of a matching circuit board in which a pattern is formed on a dielectric board by using metal wiring.

However, in the high-frequency power amplifier, there is a case in which due to either variations in the assembly of matching circuit boards and wires connecting the matching circuit boards, or the occurrence of a mismatch between the design impedance and the load impedance which is caused by a change of the characteristics of the transistor itself, the capability of the transistor cannot be brought out maximally. There is, in addition to a case in which the characteristics of the transistor itself change due to non-intended variations in the characteristics, a case in which the characteristics change with a change of the specifications, or the like.

A high-frequency power amplifier including, as a means for compensating for this mismatch between the design impedance and the load impedance, an output matching circuit comprised of an open stub whose line length is variable depending on the presence or absence of connection of a wire to an island pattern, and a line having a length of one-quarter wavelength at the frequency of the fundamental wave of a high frequency signal is disclosed in the following Patent Literature 1.

In this high-frequency power amplifier, an adjustment of the design impedance is performed by changing the number of wires connected for an island pattern disposed close to an output matching circuit pattern.

CITATION LIST

Patent Literature

Patent Literature 1: Japanese Unexamined Patent Application Publication No. Hei 6-61760

SUMMARY OF INVENTION

Technical Problem

Because the conventional high-frequency power amplifier is configured as above, in the case in which only a reactance component is included in the impedance component to be compensated for the mismatch, the mismatch amount can be adjusted and reduced by changing the number of wires connected. However, a problem is that in the case in which there is such a specification change as a change of the transistor size as a result of changing the gate width of each transistor mounted, the mismatch cannot be compensated for even though the number of wires connected is changed because not only a reactance component but also a resistance component is included in the impedance component to be compensated for the mismatch.

The present invention is made in order to solve the above-mentioned problem, and it is therefore an object of the present invention to provide a high-frequency power amplifier that can compensate for a mismatch of an impedance component having a resistance component and a reactance component.

Solution to Problem

A high-frequency power amplifier according to the present invention is configured so as to include: a transistor for amplifying a high frequency signal; a matching circuit in which an end thereof is connected to an output terminal of the transistor, and another end thereof is grounded; a first transmission line in which an end thereof is connected to the output terminal of the transistor; a second transmission line in which a direction of the line width of an end line which is a line of an end portion thereof is aligned with a direction different from a direction of the line width of the first transmission line, and in which an end thereof opposite to the end portion is connected to an output terminal; a first connecting member for connecting another end of the first transmission line and the end line of the second transmission line; plural island patterns in which ends thereof are arranged in the vicinity of the first transmission line and other ends thereof are arranged in the vicinity of the end line in the second transmission line; a second connecting member capable of connecting an end of an island pattern and the first transmission line; and a third connecting member capable of connecting another end of the island pattern and the end line of the second transmission line.

Advantageous Effects of Invention

According to the present invention, because the configuration is provided in which the plural island patterns in which ends thereof are arranged in the vicinity of the first transmission line and other ends thereof are arranged in the vicinity of the end line in the second transmission line, the second connecting member capable of connecting an end of an island pattern and the first transmission line, and the third connecting member capable of connecting another end of the island pattern and the end line of the second transmission line are included, there is provided an advantage of being able to compensate for a mismatch of the impedance component having a resistance component and a reactance component, by changing the number of second connecting members and the number of third connecting members, the second and third connecting members connecting an island pattern to the first and second transmission lines.

DESCRIPTION OF EMBODIMENTS

Hereafter, in order to explain this invention in greater detail, embodiments of the present invention will be described with reference to accompanying drawings.

Embodiment 1

Figure 1:
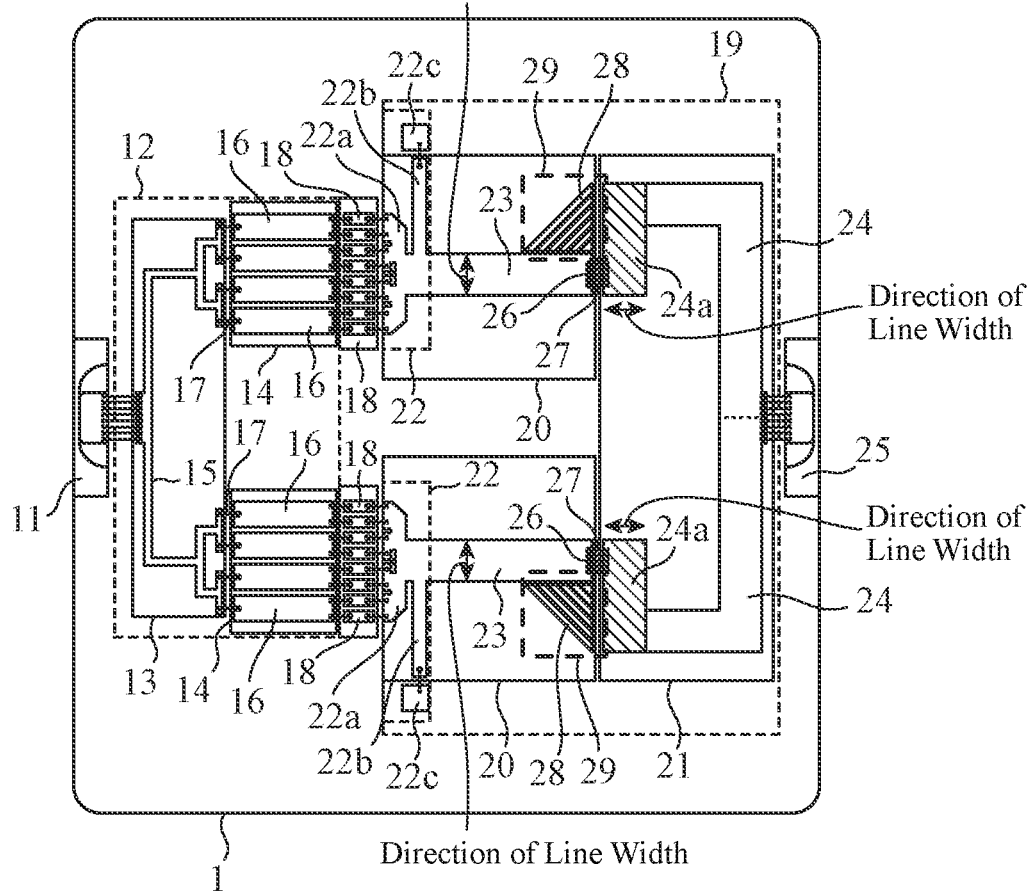
FIG. 1 is a schematic diagram showing a high-frequency power amplifier according to Embodiment 1 of the present invention.

FIG. 1 is a schematic diagram showing a high-frequency power amplifier according to Embodiment 1 of the present invention.

In FIG. 1, the high-frequency power amplifier includes an input matching circuit 12, transistors 18, and an output matching circuit 19 which are formed on a package 1.

The input terminal 11 receives a high frequency signal such as a microwave or a millimeter wave.

The input matching circuit 12 includes an input matching circuit board 13 and input matching circuit boards 14, and matches the input impedances of the transistors 18.

The input matching circuit board 13 is the one on which a pattern of a transmission line 15 having an end connected to the input terminal 11 is formed.

Each input matching circuit board 14 is the one in which a pattern of transmission lines 16 is formed.

Each wire 17 connects another end of the transmission line 15 and an end of a transmission line 16.

Each transistor 18 is an amplifying element whose input terminal is connected to another end of a transmission line 16, and which amplifies a high frequency signal which has passed through the input matching circuit 12, and outputs the high frequency signal after amplification.

In the example of FIG. 1, eight transmission lines 16 are wired and sixteen transistors 18 are mounted in parallel.

For example, in a case in which the transistors 18 are field effect transistors, their gate terminals serve as input terminals and their drain terminals serve as output terminals.

However, the transistors 18 are not limited to field effect transistors, and can be, for example, bipolar transistors.

The output matching circuit 19 includes output matching circuit boards 20 and an output matching circuit board 21, and matches the output impedances of the transistors 18.

Each output matching circuit board 20 is the one in which a matching circuit 22 and a transmission line 23 are formed.

The output matching circuit board 21 is the one in which a transmission line 24 is formed.

The matching circuit 22 is connected to the output terminals of plural transistors 18 connected in parallel, and includes a combining circuit 22a that combines the high frequency signals amplified by the plural transistors 18, a shunt inductor 22b, and a capacitor 22c. A transmission line and an open stub can be included in the matching circuit 22.

The transmission line 23 is a first transmission line having an end connected to the output terminals of transistors 18, and the line length of the transmission line 23 is a one-quarter wavelength at the frequency of the fundamental wave of the high frequency signal. Because the combining circuit 22a has a very short length in a direction of the input/output of the package 1, and the lengths from the output terminals of the transistor 18 to the connecting location of the shunt inductor 22b are very short, it can be assumed that the line length of the transmission line 23 is the length from the connecting location of the shunt inductor 22b to an end portion to which wires 26 are connected.

The transmission line 24 is a second transmission line in which a direction of the line width of each end line 24a which is a line of an end portion thereof is aligned with a direction different from that of the line width of each transmission line 23, and an end on the opposite side of the end portions is connected to an output terminal 25. In FIG. 1, each end line 24a is a hatched portion.

The line length of the transmission line 24 is the one-quarter wavelength at the frequency of the fundamental wave of the high frequency signal. The line length of the transmission line 24 is the length from the tip of each end line 24a to the position at which the transmission line is connected to the output terminal 25. The position at which the transmission line 24 is connected to the output terminal 25 is shown by a broken line in the figure.

Although the example in which the direction of the line width of each end line 24a of the transmission line 24 and the direction of the line width of each transmission line 23 are perpendicular to each other is shown in FIG. 1, the end lines 24a of the transmission line 24 and the transmission lines 23 can be arranged in such a way that an angle formed between each of the end lines 24a of the transmission line 24 and one of the transmission lines 23, the angle defining an included-angle portion 29 in which an island pattern 28 mentioned later is formed, is an acute angle equal to or less than 90 degrees, or the end lines 24a of the transmission line 24 and the transmission lines 23 can be arranged in such a way that the angle formed between each of the end lines 24a of the transmission line 24 and one of the transmission lines 23 is an obtuse angle greater than 90 degrees.

The output terminal 25 is the one via which the high frequency signal after amplification which has passed through the output matching circuit 19 after having been outputted from the output terminals of the transistors 18 is outputted, and a 50Ω external load is usually connected to the output terminal 25.

Wires 26 are first connecting members each of which connects another end of one of the transmission lines 23 and one of the end lines 24a of the transmission line 24.

Although in FIG. 1 the example in which the first connecting members are the wires 26 is shown, the first connecting members are not limited to the wires 26, and can be, for example, golden ribbon sheets or the likes.

Each connecting portion 27 is one where the other end of one of the transmission lines 23 and an end line 24a of the transmission line 24 are connected via wires 26.

Each island pattern 28 is a wire pattern of which one end is arranged in the vicinity of one of the transmission lines 23, and of which another end is arranged in the vicinity of one of the end lines 24a in the transmission line 24.

Each included-angle portion 29 is an area which is interposed between one of the transmission lines 23 and one of the end lines 24a of the transmission line 24.

Although in the example of FIG. 1, six island patterns 28 are arranged in each included-angle portion 29, the number of island patterns 28 is not limited to six, and one or more island patterns 28 are only required to be arranged.

Although in the example of FIG. 1, the shapes of the five island patterns 28 out of the six island patterns 28, except for the island pattern 28 closest to one connecting portion 27, are isosceles trapezoids, the shape of the island pattern 28 closest to one connecting portion 27 can also be an isosceles trapezoid.

In the example of FIG. 1, the widths and the arrangement intervals of the six island patterns 28 are identical.

Figure 2:
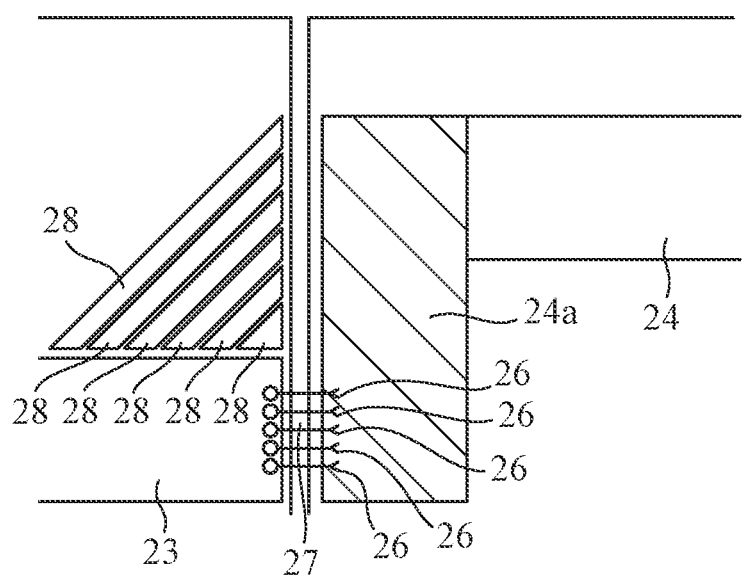
FIG. 2 is a schematic diagram showing a main part of the high-frequency power amplifier according to Embodiment 1 of the present invention.
Figure 3:
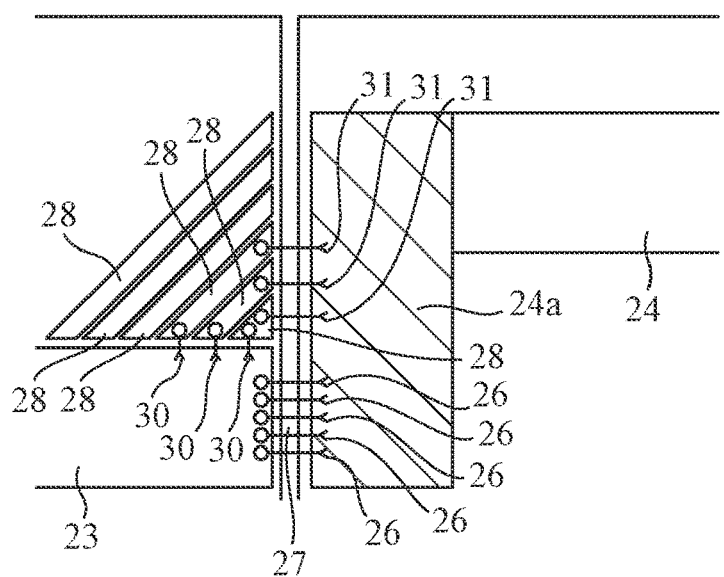
FIG. 3 is a schematic diagram showing the main part of the high-frequency power amplifier according to Embodiment 1 of the present invention.
Figure 4:
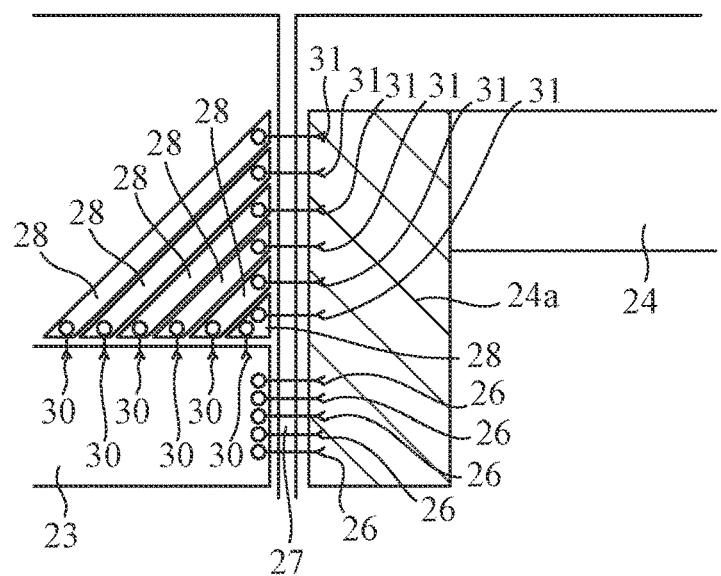
FIG. 4 is a schematic diagram showing the main part of the high-frequency power amplifier according to Embodiment 1 of the present invention.

FIGS. 2, 3, and 4 are schematic diagrams showing the main part of the high-frequency power amplifier according to Embodiment 1 of the present invention.

FIG. 2 shows an example in which the island patterns 28 are not connected to the transmission lines 23 and 24 via wires 30 and 31 mentioned later, and FIG. 3 shows an example in which three island patterns 28 are connected to the transmission lines 23 and 24 via three wires 30 and three wires 31. Further, FIG. 4 shows an example in which the six island patterns 28 are connected to the transmission lines 23 and 24 via six wires 30 and six wires 31.

In FIGS. 2 to 4, each wire 30 is a second connecting member capable of connecting an end of an island pattern 28 and the transmission line 23.

Each wire 31 is a third connecting member capable of connecting another end of an island pattern 28 and one of the end lines 24a of the transmission line 24.

Increasing the number of island patterns 28 connected to the transmission lines 23 and 24 by using wires 30 and 31 is equivalent to increase in the line width of the transmission line 23. Further, increasing the number of island patterns 28 connected to the transmission lines 23 and 24 by using wires 30 and 31 is equivalent to decrease in the line length of the transmission line 24.

Although in FIG. 1 the example in which the second connecting members are the wires 30 and the third connecting members are the wires 31 is shown, the second and third connecting members are not limited to the wires, and can be, for example, golden ribbon sheets or the likes.

Next, operations will be explained.

An explanation will be made about the principle that makes it possible to compensate for a mismatch of the impedance component having not only a reactance component but also a resistance component by changing the number of island patterns 28 connected to the transmission lines 23 and 24.

Hereafter, the state of FIG. 2 in which the number of wires 30 and the number of wires 31, the wires connecting the island patterns 28 and the transmission lines 23 and 24, are zero is referred to as "state A", the state of FIG. 3 in which the number of wires 30 and the number of wires 31, the wires connecting the island patterns 28 and the transmission lines 23 and 24, are three is referred to as "state B", and the state of FIG. 4 in which the number of wires 30 and the number of wires 31, the wires connecting the island patterns 28 and the transmission lines 23 and 24, are six is referred to as "state C."

Figure 5:
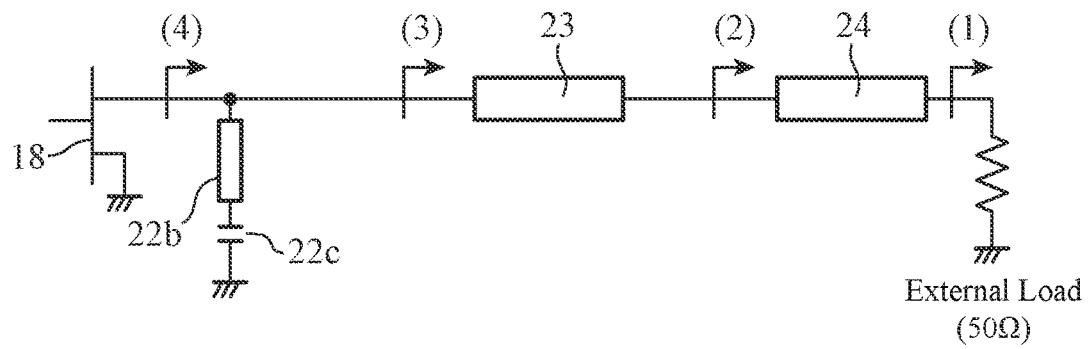
FIG. 5 is an equivalent circuit showing an output matching circuit 19 of the high-frequency power amplifier according to Embodiment 1 of the present invention.

FIG. 5 is an equivalent circuit showing the output matching circuit 19 of the high-frequency power amplifier according to Embodiment 1 of the present invention.

Figure 6:
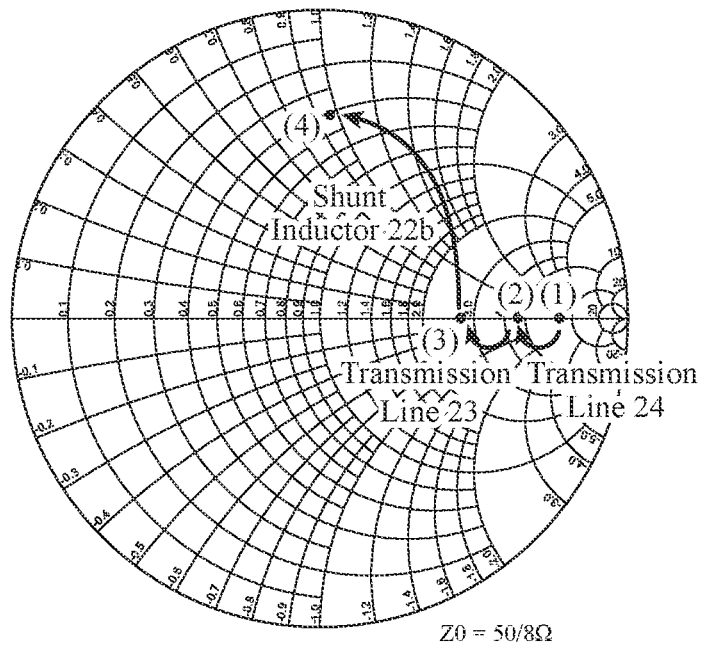
FIG. 6 is a Smith chart showing an example of a locus of a transformation of a design impedance in a state B.

FIG. 6 is a Smith chart showing an example of the locus of transformations of a design impedance in the state B.

More specifically, FIG. 6 shows an example of the locus of transformations of the impedance when the external load is viewed from the transistors 18.

(1) to (4) in FIG. 6 correspond to the impedances when the external load is viewed from points (1) to (4) shown in FIG. 5.

In the case in which each of the line lengths of the transmission lines 23 and 24 is the one-quarter wavelength at the frequency of the fundamental wave of the high frequency signal, when an impedance transformation from the point (1) to the point (2) and an impedance transformation from the point (2) to the point (3) are performed, the design impedances at the points (2) and (3) are transformed onto the real axis of the Smith chart, as shown in FIG. 6.

Further, the design impedance is transformed from the point (3) to the point (4) by the shunt inductor 22b.

The circuit design is performed in such a way that the design impedance at the point (4) usually matches the load impedance which is the target impedance.

Here, a change of the impedance transformations when the number of wires 30 and the number of wires 31 are changed, the wires connecting the island patterns 28 and the transmission lines 23 and 24, is examined.

Figure 7:
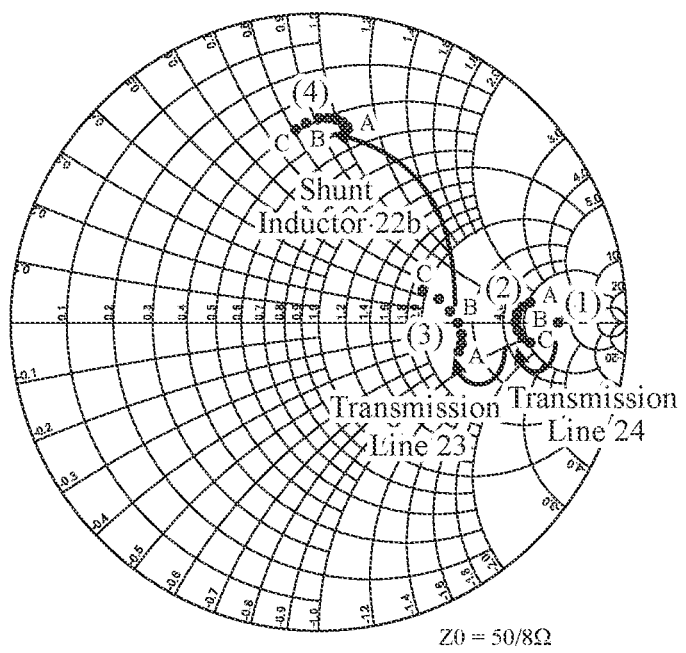
FIG. 7 is an explanatory drawing showing a change of the transformation locus in the design impedance in a case of changing the number of wires 30 and 31 connecting an island pattern 28 and transmission lines 23 and 24.

FIG. 7 is an explanatory drawing showing a change of the locus of the transformations in the design impedance when the number of wires 30 and the number of wires 31 are changed, the wires connecting the island patterns 28 and the transmission lines 23 and 24.

In the impedance transformation from the point (1) to the point (2), because the line length of the transmission line 24 changes with the difference in the number of wires 31 connected and, as a result, the electric length of the transmission line 24 changes, the reactance component in the design impedance at the point (2) changes.

In the impedance transformation from the point (2) to the point (3), because the line width of each transmission line 23 changes with the difference in the number of wires 30 connected and, as a result, the characteristic impedance of the transmission line 23 changes, the resistance component in the design impedance at the point (3) changes.

The design impedance at the point (4) which is transformed by the shunt inductor 22b changes with a change in the reactance component and a change in the resistance component, as shown in FIG. 7.

A, B, and C which are shown in FIG. 7 correspond to the states A, B, and C in FIGS. 2 to 4, respectively. Further, because B shown in FIG. 7 corresponds to the state B in FIG. 3, B corresponds to the Smith chart of FIG. 6.

Further, when the gate width of each transistor 18 is changed, both the resistance component and the reactance component which the transistor 18 includes change, and the load impedance providing maximum output or maximum efficiency for the transistor 18 also changes.

Figure 8:
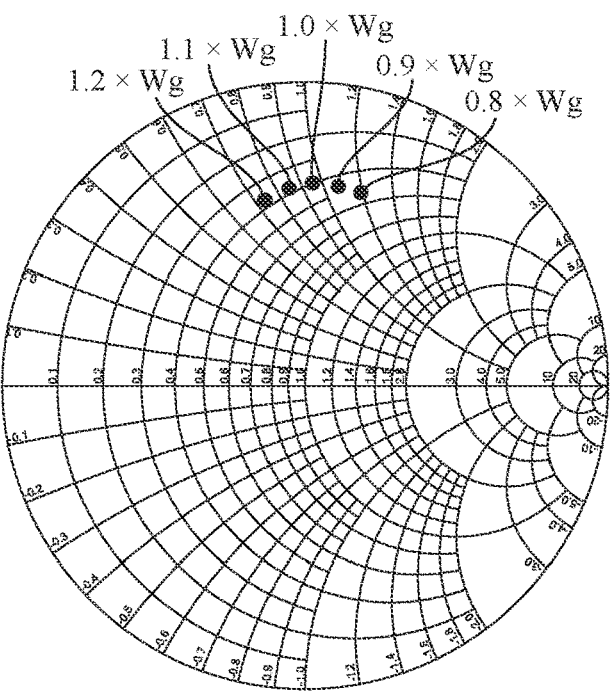
FIG. 8 is an explanatory drawing showing an example of a change of a load impedance in a case of changing from transistors 18 each having a gate width of Wg to transistors 18 each having a gate width of Wg×1.2, Wg×1.1, Wg×1.0, Wg×0.9, or Wg×0.8.

FIG. 8 is an explanatory drawing showing an example of a change of the load impedance in the case of changing from the transistors 18 each having a gate width of Wg to transistors 18 each having a gate width of Wg×1.2, Wg×1.1, Wg×1.0, Wg×0.9, or Wg×0.8.

A change of the load impedance shown in FIG. 8 matches a change shown in FIG. 7 of the design impedance at the point (4).

The resistance component and the reactance component which the transistor 18 includes change by changing the gate width of each transistor 18, and the load impedance also changes in response to the change of the resistance component and the reactance component. It is to be understood that, according to this Embodiment 1, a change of the design impedance which can follow such a change can be implemented by changing the number of wires 30 connected and the number of wires 31 connected.

Therefore, even though the gate width of each transistor 18 is changed in order to change the output power of the high-frequency power amplifier, a mismatch between the design impedance and the load impedance can be compensated for by changing the number of wires 30 connected and the number of wires 31 connected.

As is clear from the above description, according to this Embodiment 1, the configuration is provided, wherein plural island patterns 28 of which ends are arranged in the vicinity of a transmission line 23, and of which other ends are arranged in the vicinity of an end line 24a in the transmission line 24, a wire 30 for connecting the end of an island pattern 28 and the transmission line 23, and a wire 31 for connecting another end of the island pattern 28 and the end line 24a of the transmission line 24 are included, so that there is provided an advantage of being able to compensate for a mismatch of the impedance component having a resistance component and a reactance component, by changing the number of wires 30 and the number of wires 31, the wires 30 and 31 being configured to connect the island pattern 28 to the transmission lines 23 and 24.

Although in the example of FIG. 3, the three island patterns 28 closer to the connecting portion 27, out of the six island patterns 28, are connected to the transmission lines 23 and 24 by three wires 30 and three wires 31, this is only an example, and any three of island patterns 28 can be connected to the transmission lines 23 and 24.

More specifically, it is not necessary to connect the island patterns 28, sequentially from the island pattern 28 closer to the connecting portion 27, to the transmission lines 23 and 24, any island pattern 28 can be connected to the transmission lines 23 and 24 in accordance with the amount of mismatch between the design impedance and the load impedance.

Embodiment 2

Figure 9:
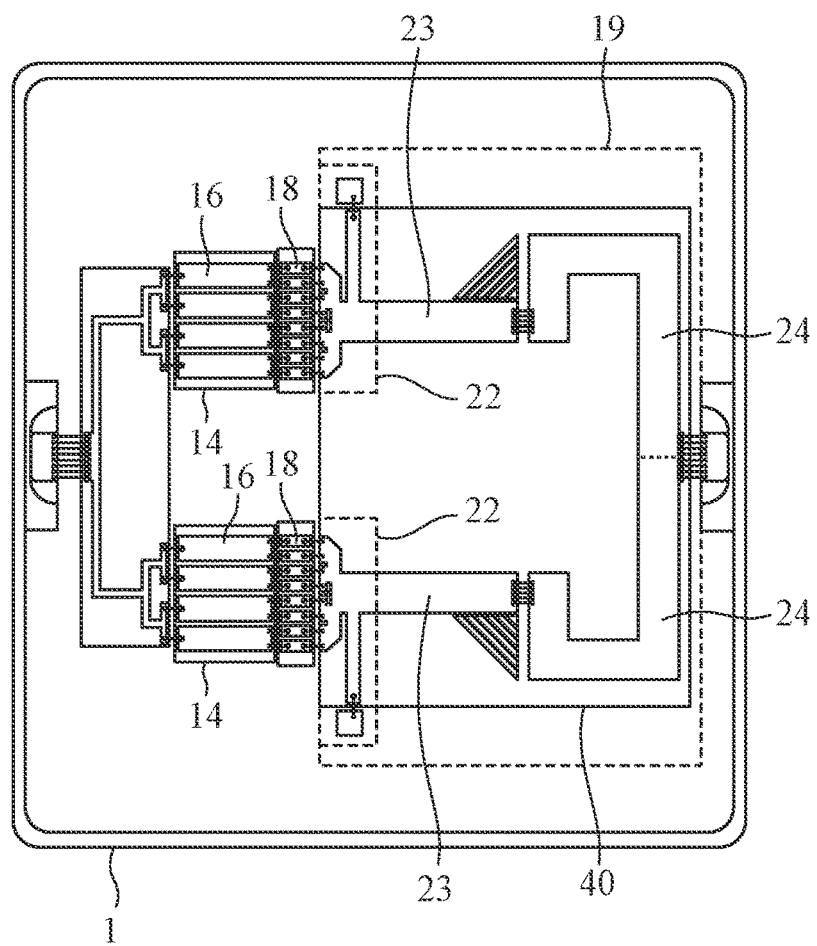
FIG. 9 is a schematic diagram showing a high-frequency power amplifier according to Embodiment 2 of the present invention.

Although in above-mentioned Embodiment 1, the example in which the transmission line 23 is formed on each of the output matching circuit boards 20, and the transmission line 24 is formed on the output matching circuit board 21 is shown, transmission lines 23 and a transmission line 24 can be formed on an identical output matching circuit board 40, as shown in FIG. 9.

More specifically, although the transmission lines 23 and the transmission lines 24 can be formed on circuit boards having different dielectric constants or different thicknesses, the transmission lines can be alternatively formed on the identical output matching circuit board 40.

FIG. 9 is a schematic diagram showing a high-frequency power amplifier according to Embodiment 2 of the present invention. In FIG. 9, because the same reference numerals as those shown in FIG. 1 denote the same components or like components, an explanation of the components will be omitted hereafter.

An output matching circuit 19 includes the output matching circuit board 40, and matches the output impedances of transistors 18.

The output matching circuit board 40 is the one on which matching circuits 22 and the transmission lines 23 and 24 are formed.

By forming the transmission lines 23 and the transmission line 24 on the identical output matching circuit board 40, in addition to the same advantage as that of above-mentioned Embodiment 1, there is provided an advantage of being able to reduce the number of components mounted, and also suppress variations in the characteristics due to variations in the assembly.

Embodiment 3

Although in above-mentioned Embodiment 1, the example in which the widths and the arrangement intervals of six island patterns 28 are the same is shown, in Embodiment 3, the widths or the arrangement intervals of parts of plural island patterns 28, the parts being closer to a transmission line 23, can differ from the widths or the arrangement intervals of other parts of the plural island patterns 28, the other parts being closer to an end line 24a of a transmission line 24.

Figure 10:
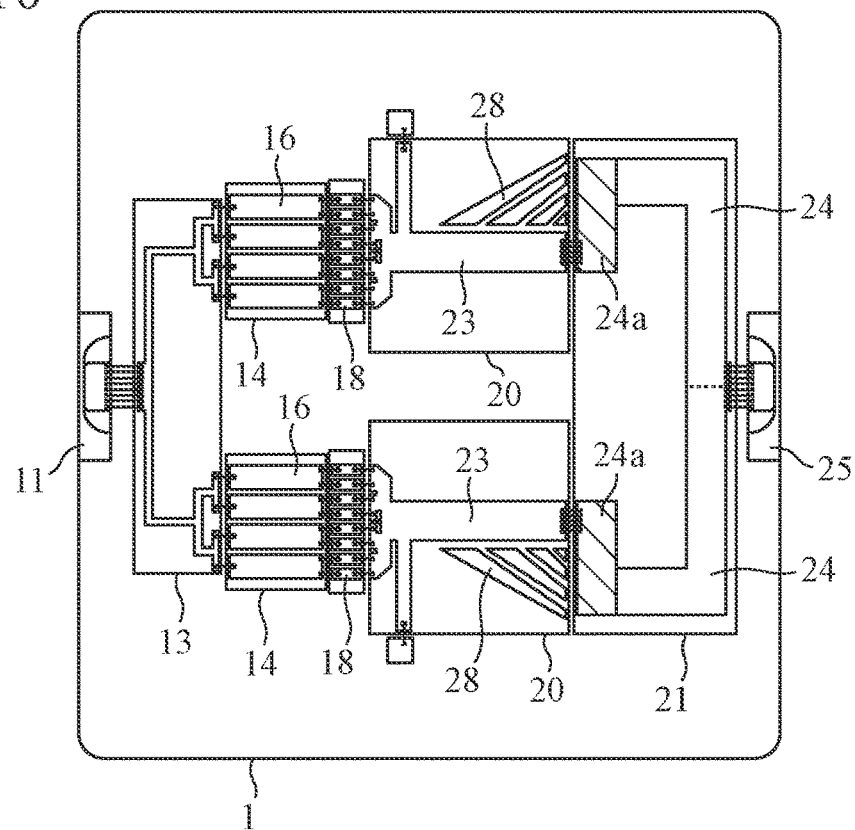
FIG. 10 is a schematic diagram showing a high-frequency power amplifier according to Embodiment 3 of the present invention.
Figure 11:
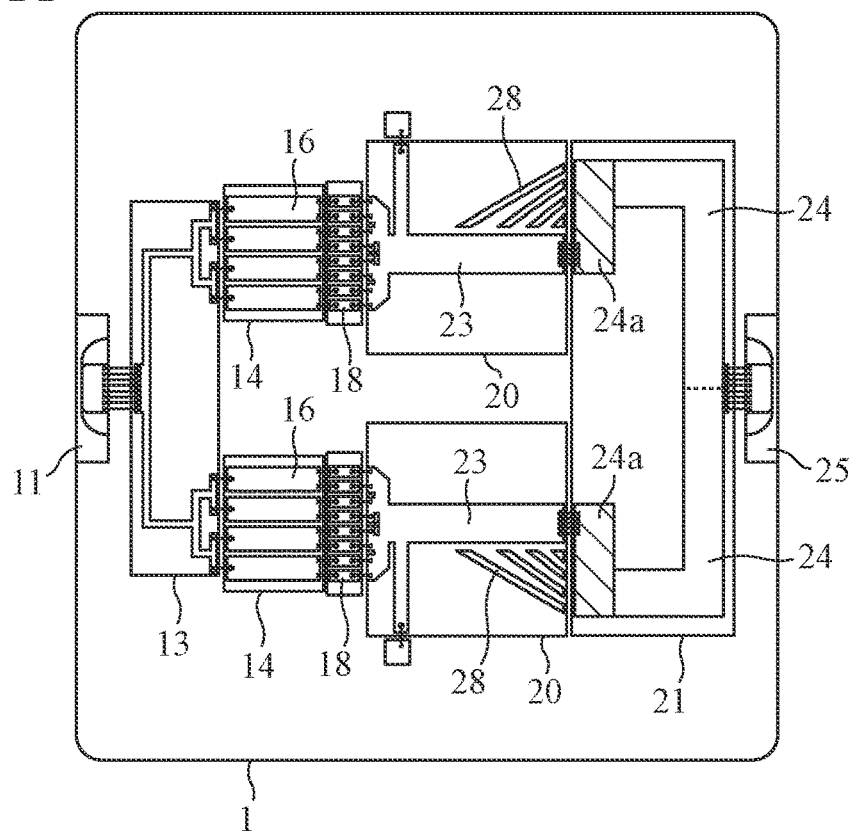
FIG. 11 is a schematic diagram showing the high-frequency power amplifier according to Embodiment 3 of the present invention.

FIGS. 10 and 11 are schematic diagrams showing a high-frequency power amplifier according to Embodiment 3 of the present invention. In FIGS. 10 and 11, because the same reference numerals as those shown in FIG. 1 denote the same components or like components, an explanation of the components will be omitted hereafter.

FIGS. 10 and 11 are schematic diagrams showing a high-frequency power amplifier according to Embodiment 3 of the present invention. In FIGS. 10 and 11, because the same reference numerals as those shown in FIG. 1 denote the same components or like components, an explanation of the components will be omitted hereafter.

FIG. 10 shows an example in which the widths of parts of plural island patterns 28, the parts being closer to a transmission line 23, differ from the widths of other parts of the plural island patterns 28, the other parts being closer to an end line 24a of the transmission line 24.

Further, as shown in FIG. 12, the widths 28a of parts of plural island patterns 28, the parts being opposite to a transmission line 23, differ from the widths 28b of other parts of the plural island patterns 28, the other parts being opposite to an end line 24a of the transmission line 24.

Figure 12A:
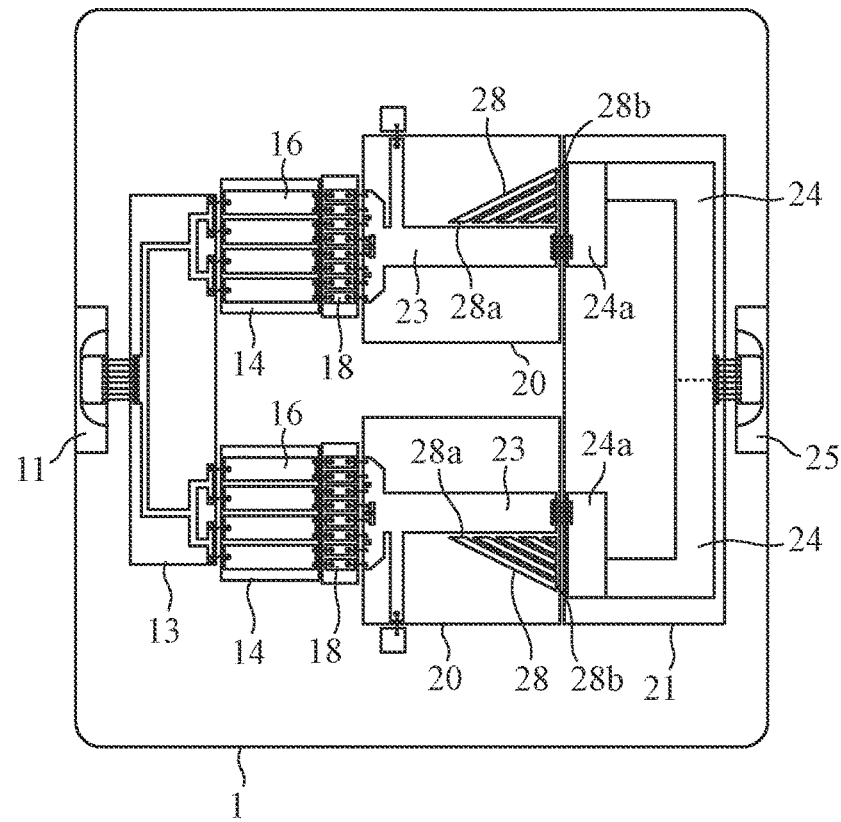
FIG. 12A is a schematic diagram showing an example in which the widths 28a of parts of island patterns 28, the parts being opposite to a transmission line 23, are wider than the widths 28b of other parts of the island patterns 28, the other parts being opposite to an end line 24a of a transmission line 24.

FIG. 12A shows an example in which the widths 28a of parts of plural island patterns 28, the parts being opposite to a transmission line 23, are wider than the widths 28b of other parts of the plural island patterns 28, the other parts being opposite to an end line 24a of the transmission line 24.

Figure 12B:
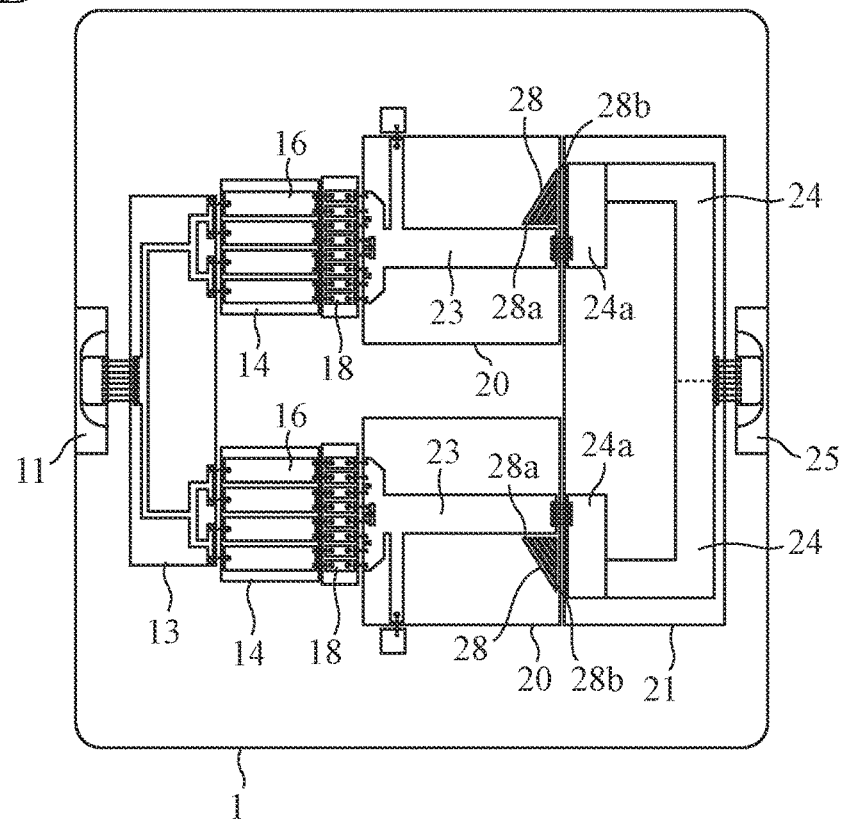
FIG. 12B is a schematic diagram showing an example in which the widths 28a of parts of island patterns 28, the parts being opposite to the transmission line 23, are narrower than the widths 28b of other parts of the island patterns 28, the other parts being opposite to an end line 24a of the transmission line 24.

FIG. 12B shows an example in which the widths 28a of parts of plural island patterns 28, the parts being opposite to a transmission line 23, are narrower than the widths 28b of other parts of the plural island patterns 28, the other parts being opposite to an end line 24a of the transmission line 24.

Also in the case of this Embodiment 3, in addition to the advantage of being able to compensate for a mismatch of the impedance component having a resistance component and a reactance component, like in the case of above-mentioned Embodiment 1, there is provided an advantage of being able to compensate for the mismatch even in a case in which there is a difference in the ratio of the reactance and resistance components of the impedance component in which the mismatch should be compensated for.

Embodiment 4

Although in above-mentioned Embodiment 1, the example in which the shape of each island pattern 28 is an isosceles trapezoid is shown, the shape of each island pattern 28 is not limited to an isosceles trapezoid.

As the shape of each island pattern 28, for example, a trapezoid, a rectangle, an L shape, a circular arc, or the like can be used.

Figure 13:
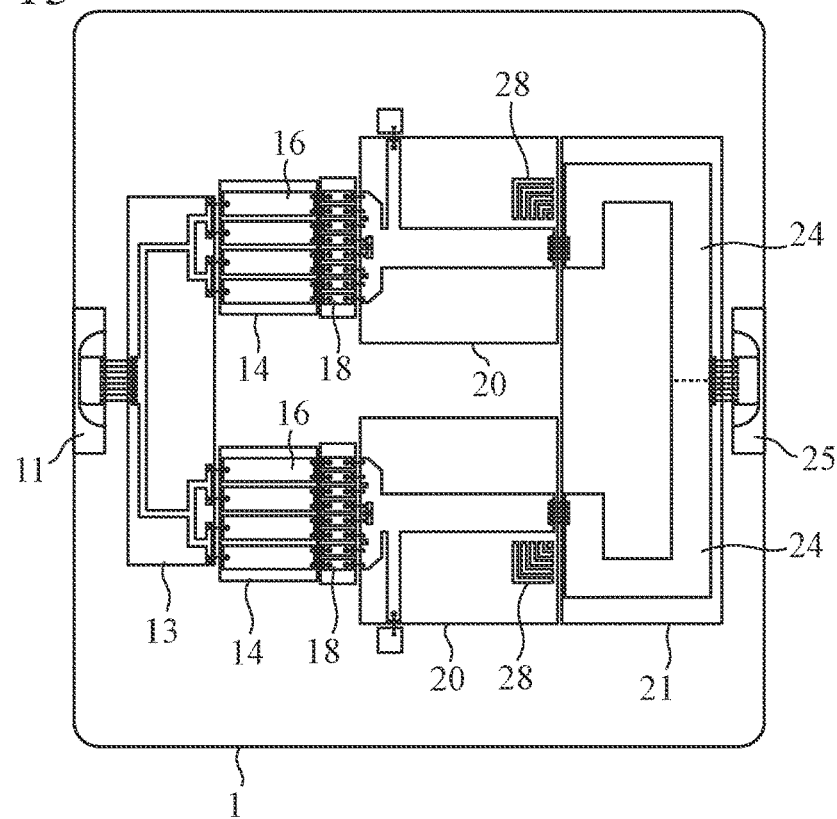
FIG. 13 is a schematic diagram showing a high-frequency power amplifier according to Embodiment 4 of the present invention.
Figure 14:
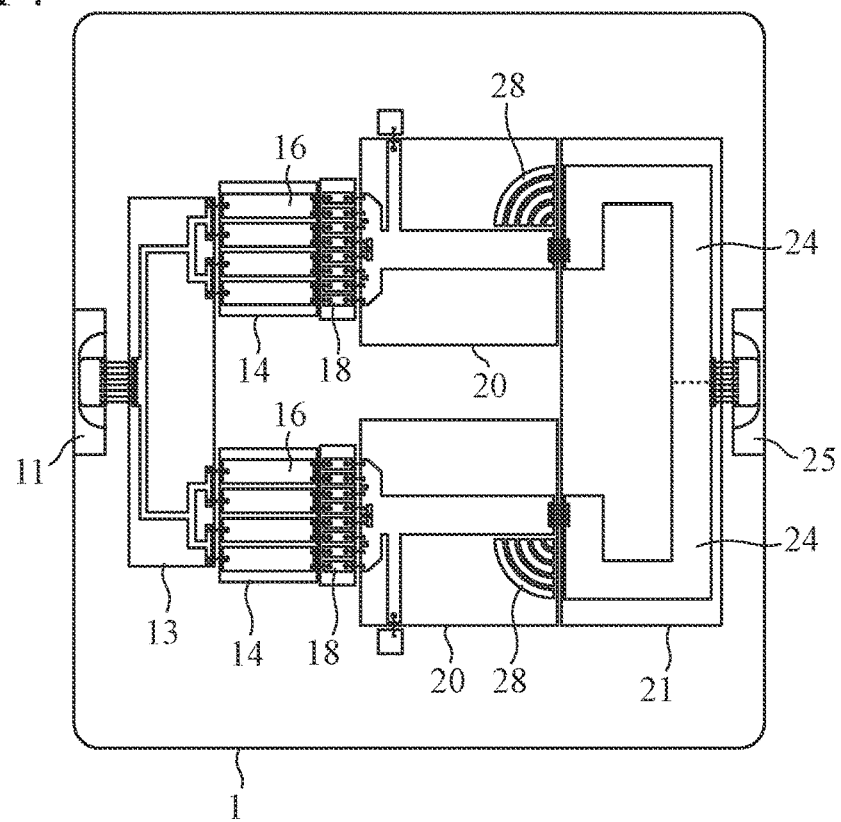
FIG. 14 is a schematic diagram showing the high-frequency power amplifier according to Embodiment 4 of the present invention.
Figure 15:
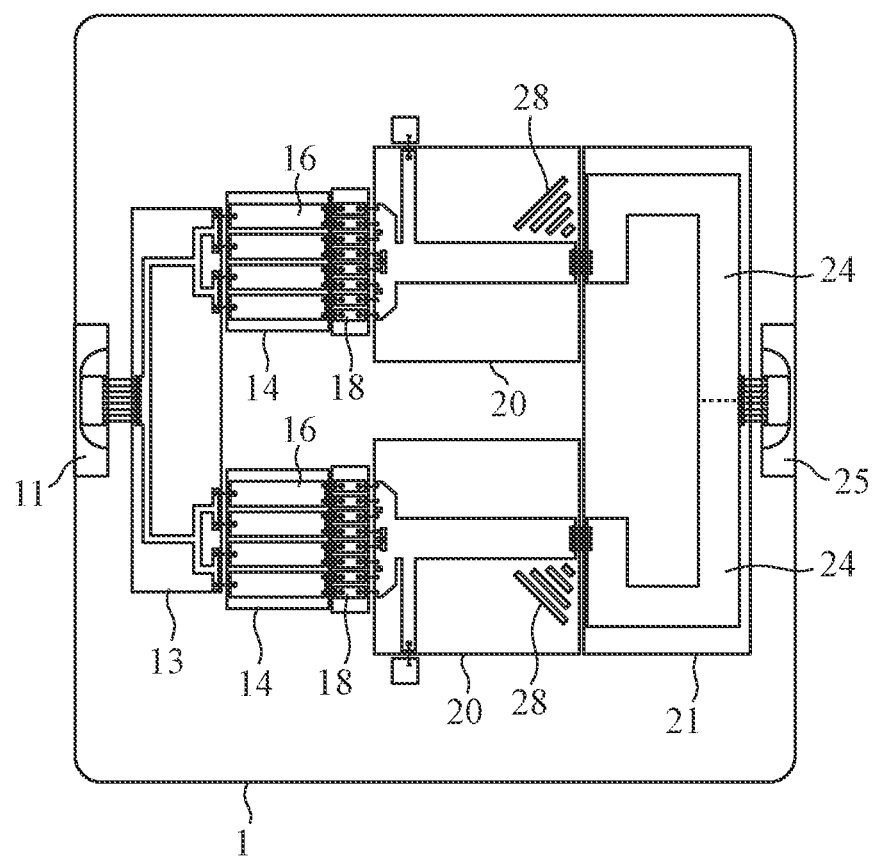
FIG. 15 is a schematic diagram showing the high-frequency power amplifier according to Embodiment 4 of the present invention.

FIGS. 13, 14, and 15 are schematic diagrams showing a high-frequency power amplifier according to Embodiment 4 of the present invention. In FIG. 13, because the same reference numerals as those shown in FIG. 1 denote the same components or like components, an explanation of the components will be omitted hereafter.

FIG. 13 shows an example in which the shape of each island pattern 28 is an L shape, FIG. 14 shows an example in which the shape of each island pattern 28 is a circular arc, and FIG. 15 shows an example in which the shape of each island pattern 28 is a rectangle.

FIG. 12 in above-mentioned Embodiment 3 shows an example in which the shape of each island pattern 28 is a trapezoid.

Also in the case of this Embodiment 4, there is provided an advantage of being able to compensate for a mismatch of the impedance component having a resistance component and a reactance component, like in the case of above-mentioned Embodiment 1. Further, there is provided an advantage of, in addition to improving the flexibility of the layout design, being able to adjust in advance the ratio of the reactance and resistance components of the impedance component in which the mismatch should be compensated for.

Embodiment 5

Although in above-mentioned Embodiment 1, the example in which the transmission lines 23 are formed in a straight line pattern parallel to the input/output direction of the package 1, and the transmission line 24 is formed in such a way that the direction of the line width of each end line 24a in the transmission line 24 is perpendicular to the direction of the line width of one of the transmission lines 23 is shown, the formation of the transmission lines 23 and 24 is not limited to this example.

More specifically, a configuration can be provided in which plural island patterns 28 are arranged in each included-angle portion 29 which is an area interposed by a transmission line 23 and a transmission line 24, and, by increasing the number of island patterns 28 connected to the transmission lines 23 and 24 by using wires 30 and 31, the line width of one of the transmission lines 23 and 24 is widened and the line length of the other one of the transmission lines is changed.

Figure 16:
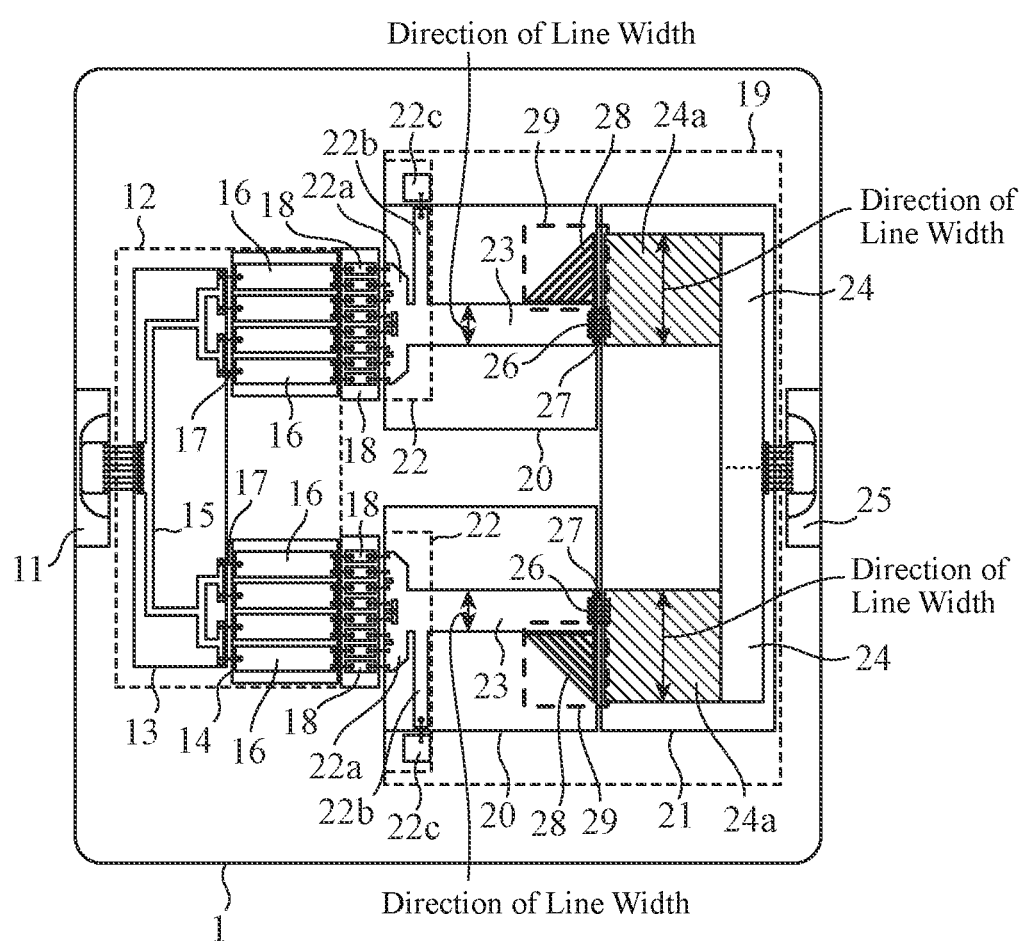
FIG. 16 is a schematic diagram showing a high-frequency power amplifier according to Embodiment 5 of the present invention.

Therefore, the transmission line 24 can be arranged in such a way that a direction of the line width of each end line 24a is the same as a direction of the line width of the transmission line 23, as shown in FIG. 16.

FIG. 16 is a schematic diagram showing a high-frequency power amplifier according to Embodiment 5 of the present invention. In FIG. 16, because the same reference numerals as those shown in FIG. 1 denote the same components or like components, an explanation of the components will be omitted hereafter.

In the example of FIG. 16, the end lines 24a of the transmission line 24 are formed in a straight line pattern parallel to a direction of the input/output of a package 1, and the direction of the line width of each end line 24a is the same as the direction of the line width of the transmission line 23.

Figure 17:
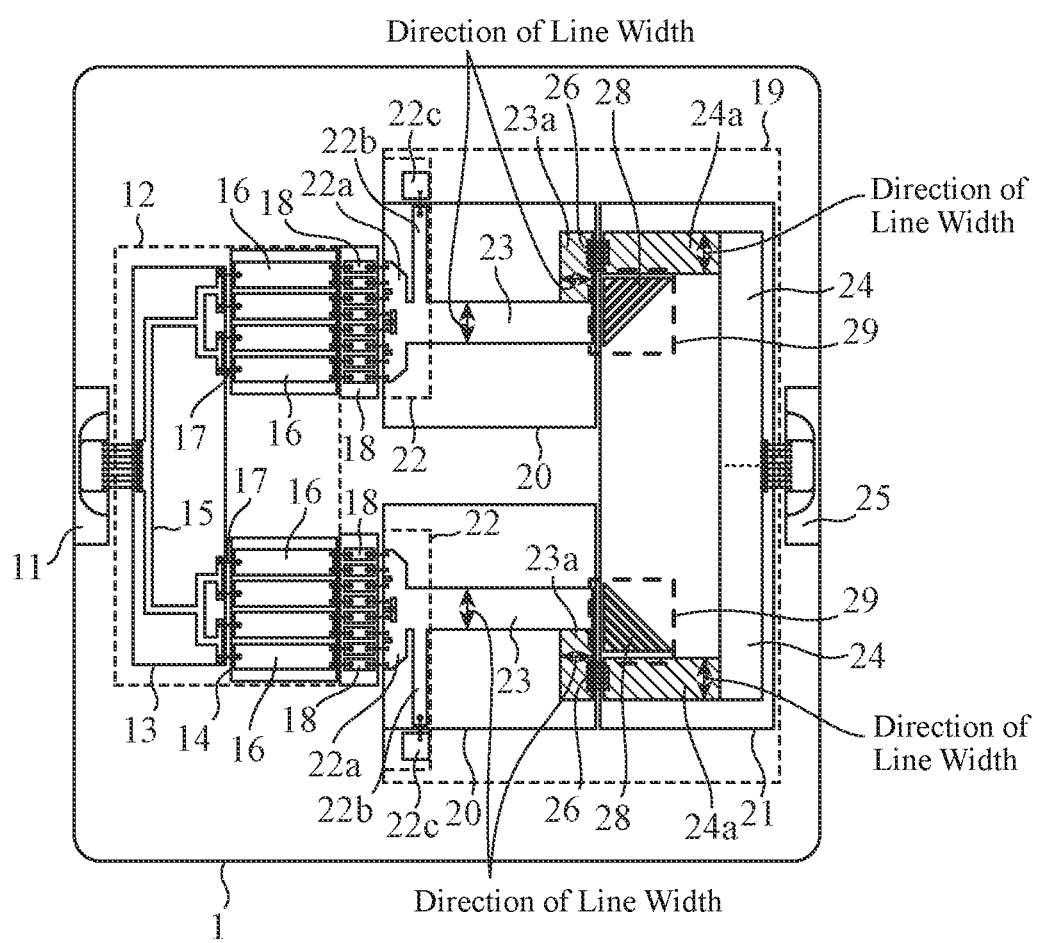
FIG. 17 is a schematic diagram showing the high-frequency power amplifier according to Embodiment 5 of the present invention.

Each transmission line 23 can be bent at some point thereof, as shown in FIG. 17. Each line 23a is an output-side line of the transmission line 23 which is bent at some point of the transmission line, and is hatched in the figure.

However, in the example of FIG. 17, the direction of the line width of the output-side line 23a of each transmission line 23 is different from the direction of the line width of each end line 24a in the transmission line 24. Further, the included-angle portions 29 in each of which island patterns 28 are arranged are formed on an output matching circuit board 21.

It is seen from the above that the layout design of the transmission lines 23 and 24 and the island patterns 28 can be performed with a high degree of flexibility.

It is to be understood that any combination of two or more of the above-mentioned embodiments can be made, various changes can be made in any component according to any one of the above-mentioned embodiments, and any component according to any one of the above-mentioned embodiments can be omitted within the scope of the invention.

INDUSTRIAL APPLICABILITY

The present invention is suitable for a high-frequency power amplifier that amplifies a high frequency signal.

REFERENCE SIGNS LIST 1 package, 11 input terminal, 12 input matching circuit, 13 input matching circuit board, 14 input matching circuit board, 15, 16 transmission line, 17 wire, 18 transistor, 19 output matching circuit, 20 output matching circuit board, 21 output matching circuit board, 22 matching circuit, 22a combining circuit, 22b shunt inductor, 22c capacitor, 23 transmission line (first transmission line), 23a output-side line of transmission line 23, 24 transmission line (second transmission line), 24a end line of transmission line 24, 25 output terminal, 26 wire (first connecting member), 27 connecting portion, 28 island pattern, 29 included-angle portion, 30 wire (second connecting member), 31 wire (third connecting member), and 40 output matching circuit board.

The invention claimed is:

1. A high-frequency power amplifier comprising:
   a transistor for amplifying a high frequency signal;
   a matching circuit of which one end is connected to an output terminal of the transistor, and of which another end is grounded;
   a first transmission line of which an end is connected to the output terminal of the transistor, the first transmission line having a length extending in a first direction from the output of the terminal of the transistor and a line width extending in a second direction perpendicular to the first direction;
   a second transmission line in which a line-width direction of an end line which is a line of an end portion is aligned with a direction different from the second direction in which a line-width of the first transmission line extends, and of which an end opposite to the end portion is connected to an output terminal;
   a first connecting member for connecting another end of the first transmission line and the end line of the second transmission line;
   plural island patterns of which ends are arranged in a vicinity of the first transmission line and of which other ends are arranged in a vicinity of the end line in the second transmission line;
   a second connecting member configured to connect an end of an island pattern and the first transmission line; and
   a third connecting member configured to connect another end of the island pattern and the end line of the second transmission line.

2. The high-frequency power amplifier according to claim 1, wherein a line length of each of the first and second transmission lines is a one-quarter wavelength at a frequency of a fundamental wave of the high frequency signal.

3. The high-frequency power amplifier according to claim 1, wherein the first transmission line and the second transmission line are formed on different circuit boards.

4. The high-frequency power amplifier according to claim 1, wherein the first transmission line and the second transmission line are formed on an identical circuit board.

5. The high-frequency power amplifier according to claim 1, wherein widths and arrangement intervals of the plural island patterns are identical.

6. The high-frequency power amplifier according to claim 1, wherein widths of parts of the plural island patterns, the parts being closer to the first transmission line, differ from widths of other parts of the plural island patterns, the other parts being closer to the second transmission line.

7. The high-frequency power amplifier according to claim 1, wherein arrangement intervals of parts of the plural island patterns, the parts being closer to the first transmission line, differ from arrangement intervals of other parts of the plural island patterns, the other parts being closer to the second transmission line.

8. The high-frequency power amplifier according to claim 1, wherein a shape of each of the island patterns is an isosceles trapezoid, a trapezoid, a rectangle, an L shape, or a circular arc.

9. A high-frequency power amplifier comprising:
   a transistor for amplifying a high frequency signal;
   a matching circuit of which an end is connected to an output terminal of the transistor, and of which another end is grounded;
   a first transmission line of which an end is connected to the output terminal of the transistor, the first transmission line having a length extending in a first direction from the output of the terminal of the transistor and a line width extending in a second direction perpendicular to the first direction;
   a second transmission line in which a line-width direction of an end line which is a line of an end portion thereof is aligned with a direction identical to the second direction in which theft line-width of the first transmission line extends, and in which an end thereof opposite to the end portion is connected to an output terminal;
   a first connecting member for connecting another end of the first transmission line and the end line of the second transmission line;
   plural island patterns of which ends are arranged in a vicinity of the first transmission line and of which other ends are arranged in a vicinity of the end line in the second transmission line;
   a second connecting member configured to connect an end of an island pattern and the first transmission line; and
   a third connecting member configured to connect another end of the island pattern and the end line of the second transmission line.

* * * * *